(12) United States Patent
Kuki

(10) Patent No.: US 6,275,967 B1
(45) Date of Patent: Aug. 14, 2001

(54) OPTICAL DISK DRIVE USING Y0+Y1 SIGNAL DETECTION

(75) Inventor: Ryohei Kuki, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/176,687

(22) Filed: Oct. 21, 1998

Related U.S. Application Data

(60) Provisional application No. 60/062,708, filed on Oct. 22, 1997.

(51) Int. Cl.[7] ............................. G11B 20/18; G11B 20/14
(52) U.S. Cl. ............................. 714/809; 369/59; 714/709
(58) Field of Search ............................. 369/59; 714/709, 714/809, 812, 818

(56) References Cited

U.S. PATENT DOCUMENTS

| | | | |
|---|---|---|---|
| 5,457,418 | * 10/1995 | Chang | 327/374 |
| 5,537,374 | * 7/1996 | Wachi | 369/44.34 |
| 5,757,857 | * 5/1998 | Buchwald | 375/271 |
| 5,768,320 | * 6/1998 | Kovacs et al. | 375/341 |
| 5,774,286 | * 6/1998 | Shimoda | 360/46 |
| 5,832,039 | * 11/1998 | Rijns | 375/317 |
| 5,844,741 | * 12/1998 | Yamakawa et al. | 360/65 |
| 5,917,859 | * 6/1999 | Yamasaki et al. | 375/262 |
| 5,937,020 | * 8/1999 | Hase et al. | 375/376 |
| 5,946,329 | * 8/1999 | Hirose et al. | 371/43.7 |
| 5,963,518 | * 10/1999 | Kobayashi et al. | 369/48 |
| 5,986,990 | * 11/1999 | Moon | 369/59 |

* cited by examiner

Primary Examiner—Stephen M. Baker
(74) Attorney, Agent, or Firm—W. Daniel Swayze, Jr.; W. James Brady; Frederick J. Telecky, Jr.

(57) ABSTRACT

The present invention implements a maximum likelihood detector for optical disk drive without using a Viterbi detector. The detection algorithm that includes y0+y1 detection is very simple by requiring only one adder and one comparator, and not survival path memories.

1 Claim, 4 Drawing Sheets

$y_0+y_1$ DETECTOR WITH 2T CORRECTION

2-LEVEL DETECTION
$y \geq 0$ OR $y < 0$

3-LEVEL DETECTION
$y \geq 0.5$ OR
$0.5 > y \geq -0.5$
OR $-0.5 > y$

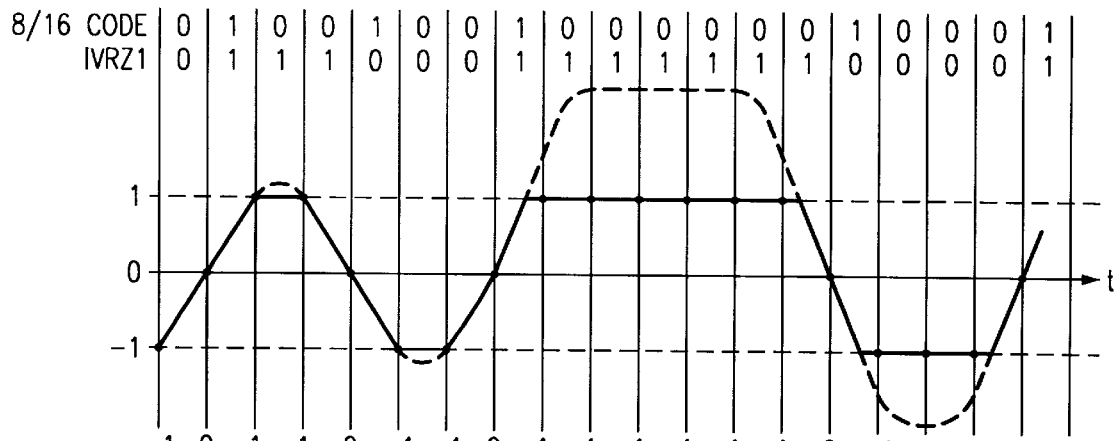
FIG. 4
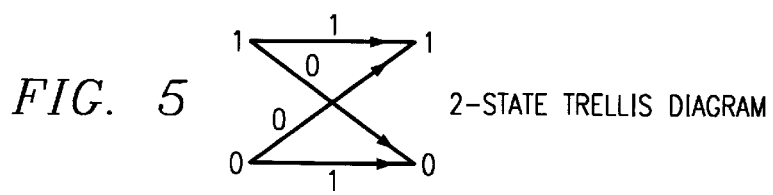
FIG. 5   2-STATE TRELLIS DIAGRAM
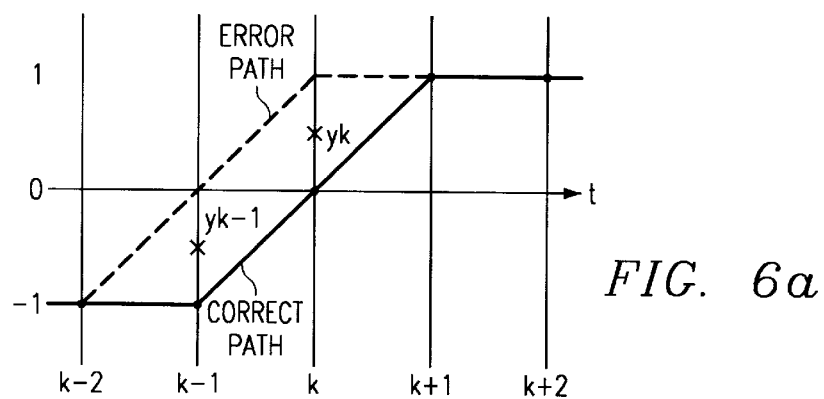
FIG. 6a
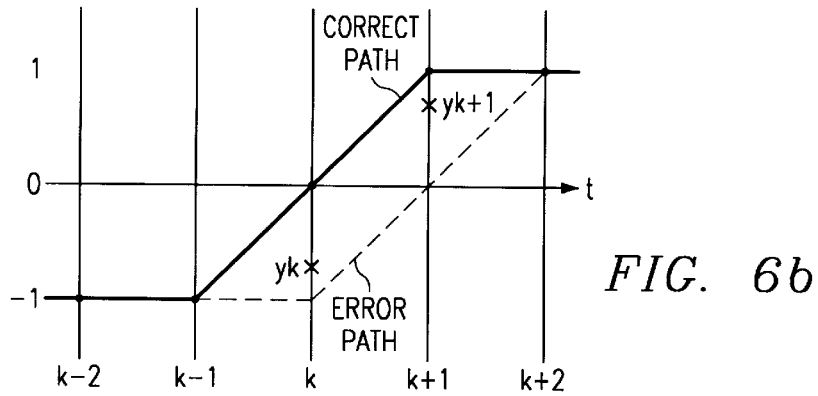
FIG. 6b

US 6,275,967 B1

OPTICAL DISK DRIVE USING Y0+Y1 SIGNAL DETECTION

This application claims benefit of provisional application No. 60/062,708 filed Oct. 22,1997.

FIELD OF THE INVENTION

The present invention relates to read channels and more particularly to a Digital Video Disk (DVD) read channel.

BACKGROUND OF THE INVENTION

Currently, DVD read channels use a bit-by-bit detection scheme because of its simplicity. The performance of the bit-by-bit detection scheme is acceptable for the DVD-Video channel which operates at the clock frequency of 26.14 MHz (1X). Recently, higher clock frequencies are required for DVD-ROM applications, for example, 6X=157 MHz, 10X= 261 MHz). The simple bit-by-bit detection is not sufficient to achieve the reliable performance for such high speed channels. Even in the low frequency applications, the high performance and low cost detector is desirable because it enables the cost reduction of other components.

The Partial Response Maximum-Likelihood, PRML, algorithm has been widely used in magnetic recording fields for improving performance, but the PRML algorithm is not acceptable for the DVD read channel because the spectrum of the wave forms from the DVD disk is difficult to equalize to partial response target spectrum.

Recently, the use of a Viterbi detector without partial response equalization has been examined, (by Hideki Hayashi et al, PIONEER R & D p. 37–43, Vol. 6 No. 2 1996 in Japanese). They reported that the error rate was reduced to be more than 2 order of magnitude. They used a 6-state trellis scheme, and 32 bits survival path memories. The detector is composed of 3000 gates, and one A to D converter.

The use of a Maximum Likelihood detector (ML detector) such as a Viterbi detector can improve the performance, but the circuit is much more complicated than that of the bit-by-bit detector, and the maximum operation speed is limited by the Add-Compare-Select, ACS, operation of the Viterbi detector.

SUMMARY OF THE INVENTION

The present invention provides improved performance and a low cost detection apparatus and method. The detection of the present invention is capable of higher operation speed than a Viterbi detector.

BRIEF DESCRIPTION OF THE DRAWINGS

FIG. 4 illustrates waveform of the present invention;

FIG. 5 illustrates at two state trellis diagram;

FIG. 6a illustrates a first error path near zero cross points;

FIG. 6b illustrates a second error path near zero cross points;

DETAILED DESCRIPTION

Bit-by-Bit Detection

Figure 1:
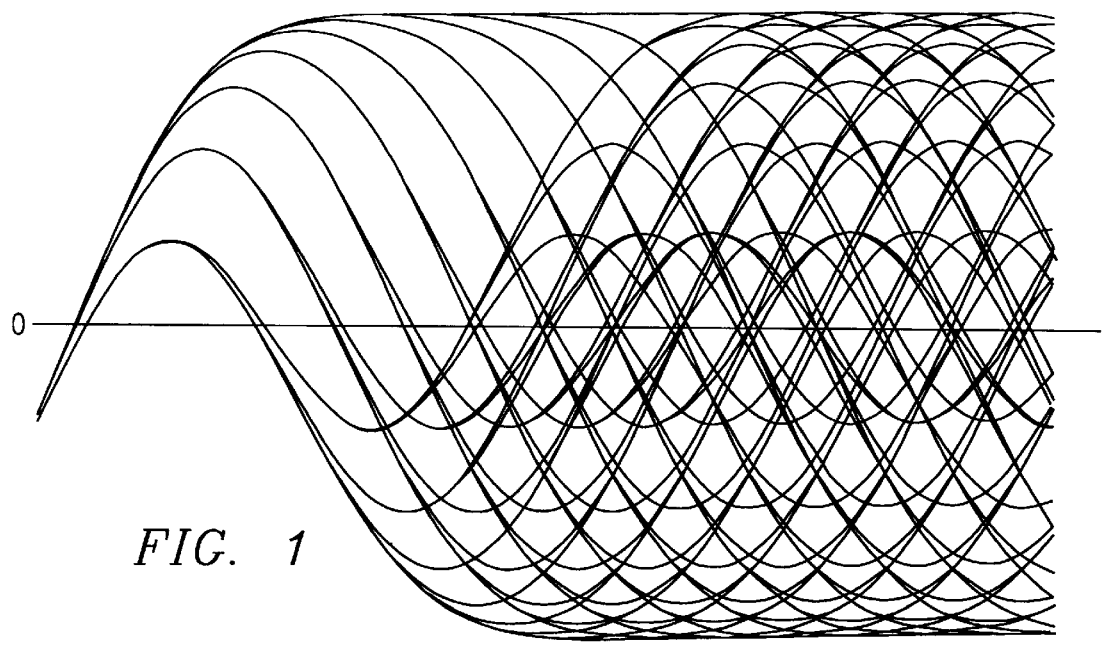
FIG. 1 illustrates a DVD read out signal eye-pattern.

Read-out signals from a DVD disk have many signal levels. The typical eye-pattern is shown in FIG. 1. Detection errors occur dominantly at signals near zero-cross transitions because the amplitude of the read-out signal becomes minimum there. (FIG. 2, FIG. 3).

2-Level Detection

Figure 2:
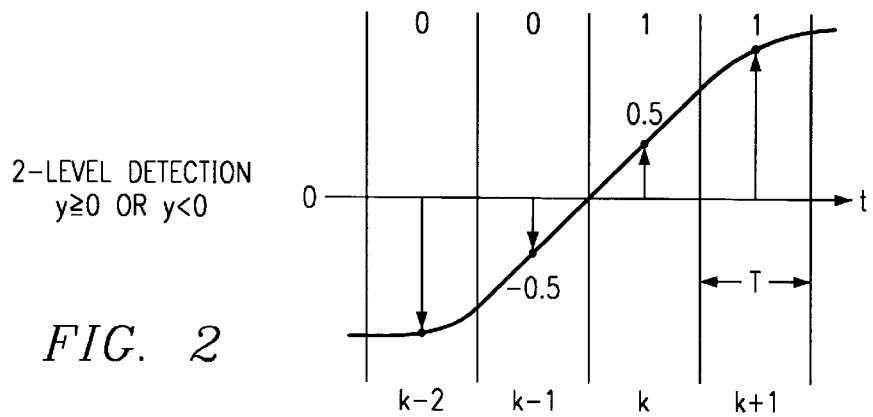
FIG. 2 illustrates second level detection.
Figure 3:
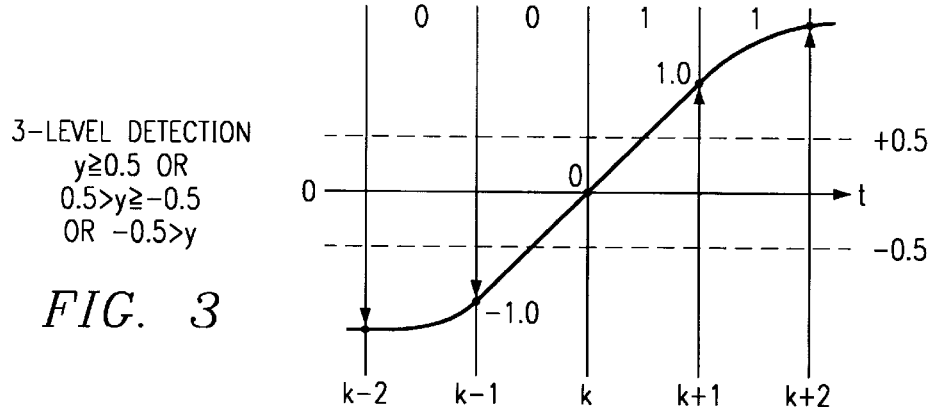
FIG. 3 illustrates third level detection.

In FIG. 2, we assume the signal value=0.5 and the noise value=$n_{k-1}$ at sample time k−1, and the signal value=0.5 and the noise value=$n_k$ at the sample time k. The sample values near the transitions are:

$$y_{k-1} = -0.5 + n_{k-1} \quad (1)$$

$$y_k = +0.5 + n_k \quad (2)$$

The error of $y_{k-1}$ occurs when $n_{k-1} > 0.5$

The error of $y_k$ occurs when $n_k < -0.5$

3-Level Detection

If the sample points of FIG. 2 are shifted by 0.5T, the signal values at k−1, k, and k+1 will be −1, 0, 1 respectively, (FIG. 3). The sample values near the transitions are:

$$y_{k-1} = -1 + n_{k-1} \quad (3)$$

$$y_k = 0 + n_k \quad (4)$$

$$y_{k-1} = +1 + n_{k+1} \quad (5)$$

The error of $y_{k-1}$ occurs when $n_{k-1} > 0.5$.

The error of $Y_k$ occurs when $n_k > 0.5$ or $n_k < -0.5$.

The error of $y_{k+1}$ occurs when $n_{k+1} < -0.5$

This 3-level detection method has approximately the same error threshold as the above 2-level detection method. With the 3-level detection the signal value may be less than ±1.

The 3-level detection method is effective in the following ML detection.

Viterbi Detection

The ML detection such as Viterbi detection requires that the read-out signals have some correlation to each other. The following two kinds of correlation in DVD channels can be utilized:

Signal Level Correlation

The use of the three level signals shown in FIG. 3 enables the ML detection because the correlation exists in these 3 levels. This correlation eliminates such read-out signal sequences as <−1,1>, <−1,0,0,1>, <−1,0,−1> and so on.

When the signal level correlation is applied to Viterbi detector, all the sample signals must be limited to 3 levels by using limiter circuits to calculate branch metrics correctly, (FIG. 4). The Viterbi detector needs only a 2-state trellis which has 3 level signals (−1,0,1) as shown in FIG. 5.

SNR Improvement by Signal Level Correlation

The Viterbi detector has the 3 worst case error paths near zero-cross points, (FIG. 6a, b, c). In FIG. 6a, when $n_{k-1} + n_k < 1$, the two sample values $y_{k-1}$ and $y_k$ are close to the correct path, and the detection will be done correctly. When $n_{k-1} + n_k > 1$ the sample values $y_{k-1}$ and $y_k$ are close to the error path, and the detection error will occur. The error threshold of the Viterbi detector is $n_{k-1} + n_k > 1$.

Figure 6C:
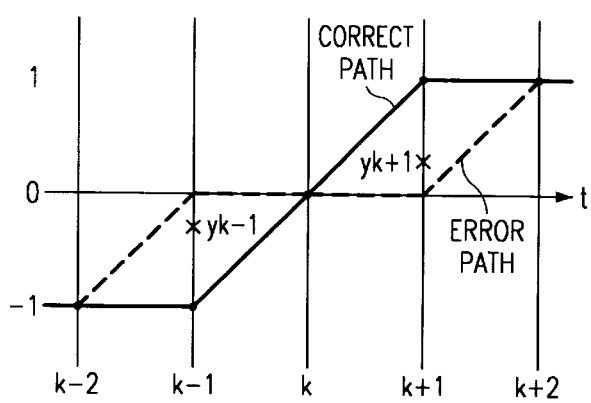
FIG. 6c illustrates a third error path near zero cross points.

It is $n_k + n_{k+1}, -1$ in the pattern shown in FIG. 6b. It is $n_{k-1} - n_{k+1} > 1$ in FIG. 6c.

These detection thresholds improve the SNR by 3 dB statistically over the bit-by-bit detection ($n_k > 0.5$ or $n_k < -0.5$) if the noise at each sample point is time independent.

Code Constraints Correlation

The DVD channel uses the 8/16 modulation code. This code is a (d=2, k=10) code. The d is the minimum zero run length between two ones, and k is the maximum zero run length between two ones. After NRZI conversation, the minimum transition period is 3T and the maximum transition period is 11T. (The T is the period of code clock.) In this code, the d=2 constraint can be used for the ML detection. This eliminates 1T and 2T patterns from the detected data sequences. The 1T's (010 and 101) and 2T's (0110 and 1001) are invalid in NRZI→NRZ 8/16 modulation code.

Figure 7:
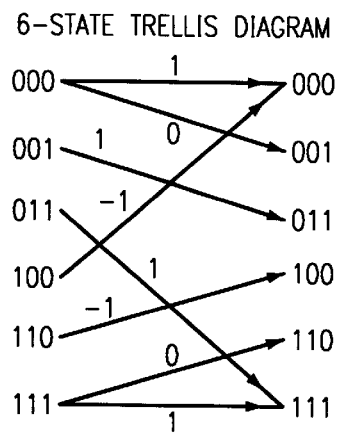
FIG. 7 illustrates a six state trellis diagram.

A 6-state Trellis is necessary to remove 1T and 2T patterns. The 6-state Trellis diagram shown in FIG. 7 uses both the signal level correlation and the code correlation.

−y(0)+y(1) Detection

The y0+y1 detection of the present invention uses 3-level signals as shown in FIG. 3 and FIG. 4, but the limitations of the amplitude of sample values is not required. After the adjacent two sample addition (y0+y1), 2-level decision is accomplished as follows:

If $y(0)+y(1)>=0, \rightarrow 1$

If $y(0)+y(1)<0, \rightarrow 0$

If the worst (minimum) signal case shown in FIG. 3, from equations (3), (4), and (5).

$$y(0)+y(1)=y_{k-1}+y_k=-1+n_{k-1}+n_k \quad (6)$$

$$y(0)+y(1)=y_k+y_{k+1}=+1+n_k+n_{k+1} \quad (7)$$

These equations show the error that occurs when $n_{k-1}=n_k>1$ or $n_k+n_{k+1}<-1$.

This error threshold is same as that of the Viterbi detector with level correlation. The added signals (1 and −1) of the equations of (6) and (7) are the worst case of the y(0)+y(1) detector.

The value of the added signals in any other sample points is always 1< or <−1. This y(0)+y(1) detection algorithm is valid for the d>=1 code. The The y(0)+y(1) detection is better than the Viterbi detector with level correlation because the y(0)+y(1) detection eliminates pattern error in FIG. 6c.

Figure 8:
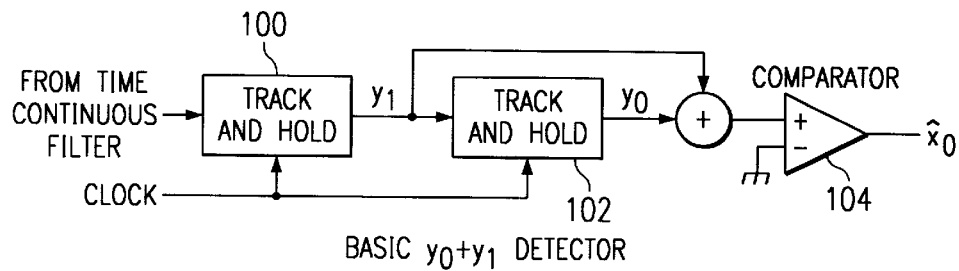
FIG. 8 illustrates a detector.

FIG. 8 shows the block diagram of the basic y(0)+y(1) detector. The analog to digital converter is not used. The analog track and hold circuits (100, 102) make one sample time delay. The output of track and hold circuit (102) is input to comparator (104).

y(0)+y(1) Detector with 2T Pattern Corrections

The basic y(0)+y(1) detector does not utilize the code correlation. The additional circuit shown in FIG. 9 can remove 2T pattern errors. The y(0)+y(1) detector is virtually free of 1T pattern errors.

When the 2T pattern is detected (x0, x−1, x−2, x−3=0110 or 1001), the error must exist in either x0 or x−3. The correction is done as follows:

The current $y(0)+y(1)$ is compared with the $y-3+y-2$.

If the y(0)+y(1) detection is wrong and the y−3+y−2 detection is correct, the absolute value of y(0)+y(1) is smaller than the absolute value of y−3+y−2 in most cases.

When the error pattern x0, x−1, x−2, x−3=0110, if y−3+y−2<y0+y1, then x0 is corrected to 1 else x−3 is corrected to 1.

When the error pattern x0, x−1, x−2, x−3=1001, if y−3+y−2<y0+y1 then x−3 is corrected to 0 else x0 is corrected to 0.

The performance of the y(0)+y(1) detector with 2T correction is approximately the same as the 6-state Viterbi detector.

Figure 9:
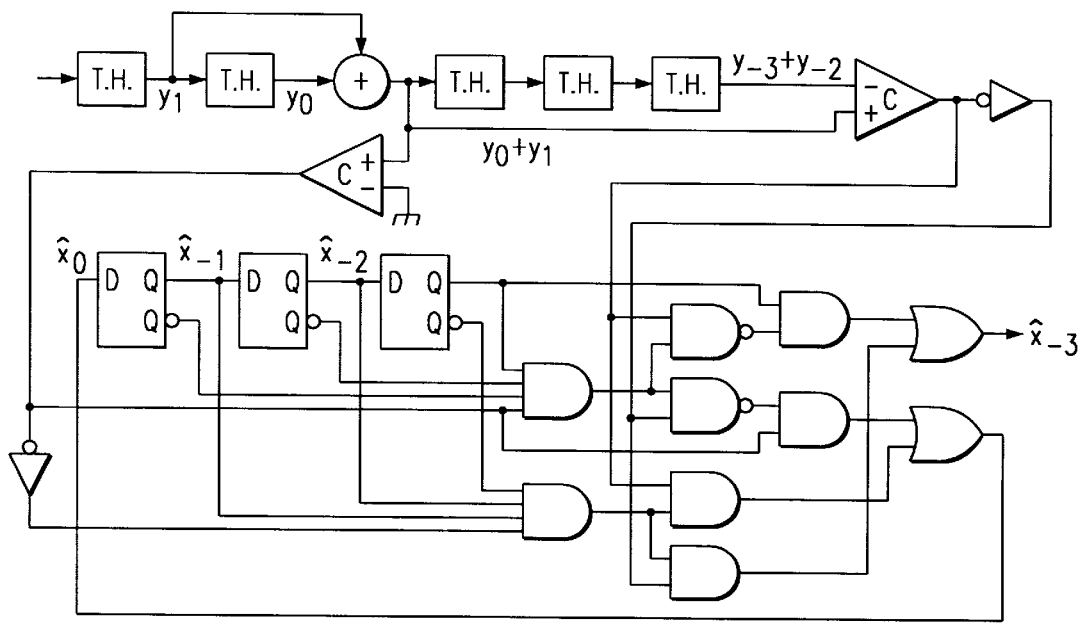
FIG. 9 illustrates a detector with correction.

The block diagram shown in FIG. 9 is for d=2 code channels.

For d=1 code channels such as 1,7 code, the 1T pattern (010 or 101) correction must be done in the similar method.

Performance Comparisons

Figure 10:
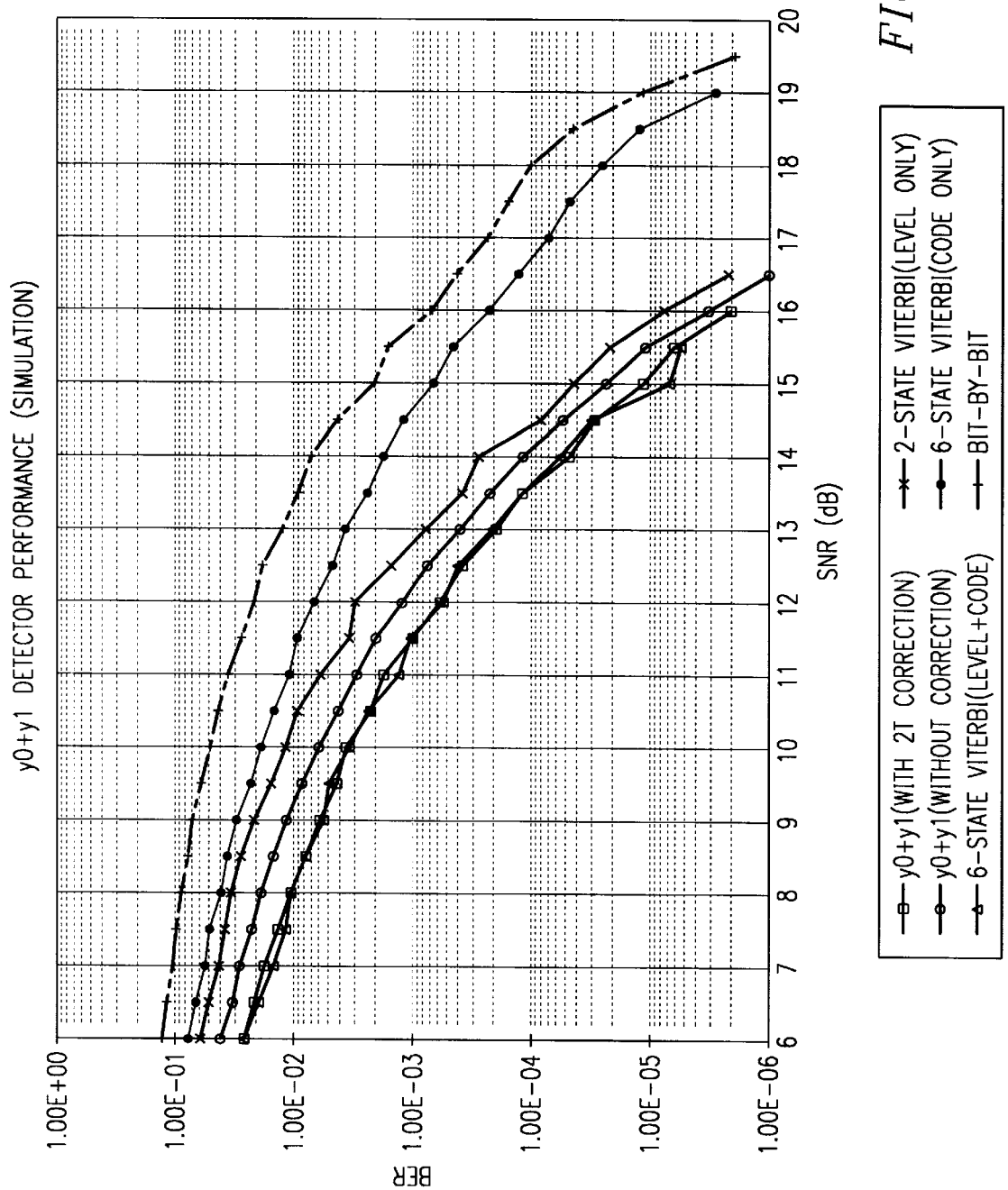
FIG. 10 illustrates a performance chart of detectors.

FIG. 10 illustrates the performance comparison of the present invention.

The y(0)+y(1) detector with 2T pattern correction and the 6-state Viterbi detector showed the best and same performance. Both detectors utilize both level correlation and code correlation.

The simple y(0)+y(1) detector and 2-state Viterbi detector is about 3 dB better than the bit-by-bit detection. Both detectors utilize only the level correlation.

The 6-state Viterbi which utilizes only the code correlation shows a little improvement.

Other Features of y(0)+y(1) detector

Easier realization of the high data rate channel.

The Viterbi detector requires branch metric calculations and path metric calculations. The y(0)+y(1) detector requires only one addition. The y0+y1 detector does not need a high speed A to D converter.

The y(0)+y(1) detector has better phase error detection

The Viterbi detector requires long survival path memories, 20 bits or more. This results in a fairly long time to get a final decision. The y0+y1 detector does not have the path memories. The decision is fast.

The phase error detection circuit for timing recovery needs some detected data. The phase error detection circuit with the y(0)+y(1) detector can use the high quality data from the y(0)+y(1) detector, but the phase error detection circuit with the Viterbi detector cannot use the high quality data from the Viterbi detector because of the too long latency. The additional simple detection circuit which has fast detection but low quality must be used.

The y(0)+y(1) detector has no limiter setting

The Viterbi detector needs an amplitude limiter to get 30 level targets shown in FIG. 4. The best setting of the limiter value is not so easily obtained because disks and read channel have many variations. The unfit setting degrades the SNR performance. The y(0)+y(1) detector does not need the limiters.

What is claimed is:

1. A y(0)+y(1) detection method for an optical disk wave form, comprising:

performing demodulation method for decoding a d>=1 modulation code;

performing 3-level sampling;

performing y(0)+y(1) addition; and performing 2 level detection,
correcting a d*T pattern;
detecting a d*T pattern; and
comparing y(0)+y(1) and y−(d+1)+y−d.

* * * * *